(12) United States Patent
Mitarai et al.

(10) Patent No.: US 7,566,956 B2
(45) Date of Patent: Jul. 28, 2009

(54) SEMICONDUCTOR COMPOSITE DEVICE AND METHOD OF MANUFACTURING THE SAME

(75) Inventors: Shun Mitarai, Kanagawa (JP); Koichi Ikeda, Kanagawa (JP); Masahiro Tada, Kanagawa (JP); Akira Akiba, Kanagawa (JP); Shinya Morita, Kanagawa (JP)

(73) Assignee: Sony Corporation, Tokyo (JP)

(*) Notice: Subject to any disclaimer, the term of this patent is extended or adjusted under 35 U.S.C. 154(b) by 166 days.

(21) Appl. No.: 11/425,077

(22) Filed: Jun. 19, 2006

(65) Prior Publication Data
US 2006/0289955 A1    Dec. 28, 2006

(30) Foreign Application Priority Data
Jun. 23, 2005   (JP) ............................. P2005-183181

(51) Int. Cl.
*H01L 23/02*   (2006.01)

(52) U.S. Cl. ...................................... 257/678; 257/414

(58) Field of Classification Search ................. 257/678, 257/723, 414, 415
See application file for complete search history.

(56) References Cited

U.S. PATENT DOCUMENTS

| 5,326,726 A * | 7/1994 | Tsang et al. .................. 438/52 |
| 2004/0152276 A1 | 8/2004 | Nishimura |

FOREIGN PATENT DOCUMENTS

| JP | 9-162462 | 12/1995 |
| JP | 2004-221285 | 8/2004 |

* cited by examiner

*Primary Examiner*—Roy K Potter
(74) *Attorney, Agent, or Firm*—Sonnenschein Nath & Rosenthal LLP (57) ABSTRACT

The present invention provides a semiconductor composite device including a semiconductor device formed on or in a substrate, an insulating film formed on the substrate so as to cover the semiconductor device, a micro electro mechanical portion formed on the insulating film, and a wiring layer connected to the semiconductor device and the micro electro mechanical portion.

2 Claims, 9 Drawing Sheets

SEMICONDUCTOR COMPOSITE DEVICE AND METHOD OF MANUFACTURING THE SAME

CROSS REFERENCES TO RELATED APPLICATIONS

The present invention contains subject matter related to Japanese Patent Application JP 2005-183181 filed in the Japanese Patent Office on Jun. 23, 2005, the entire contents of which being incorporated herein by reference.

BACKGROUND OF THE INVENTION

1. Field of the Invention

The present invention relates to a semiconductor composite device and a method of manufacturing the same such that a microelectromechanical system (MEMS) and a semiconductor device can be easily formed on the same substrate.

2. Description of the Related Art

The research and development of microelectromechanical systems (MEMS) begun in the 1970's has at present been developed in various fields such as sensor devices, actuators, optical devices, bio-devices, RF devices, power devices, etc., and some of the devices such as acceleration sensors and micromirror devices have already been commercialized and have come to be seen in daily life.

Attendant on such a progress, conversion of ordinary devices into the so-called composite devices, such as incorporation of a peripheral circuit into an originally monofunctional MEMS device so as to impart a system function to the device and incorporation of an MEMS into other device so as to enhance the added value, has been conducted vigorously in recent years. This is greatly contributed to by the fact that, since an MEMS is fundamentally based on a semiconductor process, it is possible to utilize such techniques as SiP (System in Package) and SoC (System on Chip) which have been conducted in converting other semiconductor devices into composite devices. As for the SoC, particularly, the MEMS's in recent years produced by application of advanced processes are advantageous in that their footprints have been reduced and they can be easily handled at the time of mounting onto substrates. For example, in the case of RF-MEMS and the like of which research and development have recently progressed rapidly, there is a need to finally assemble such a device into the form of a module as a communication function, so that the device is liable to share in the benefit of consolidation into one chip through SoC.

However, at the time of forming an MEMS device and other devices on the same wafer as SoC, the manufacturing method is greatly restricted by the materials and sizes of the MEMS device. Particularly, in the case of putting an MEMS into a conventional standardized process, the insertion of an MEMS process and modifications of the conventional process cause variations in the characteristics of electronic circuitry. This has a great influence on the process of forming electronic circuits which will be enhanced in performance now on, and it can be easily supposed that the influence becomes an obstacle in mounting the MEMS device and advanced semiconductor devices together.

Therefore, in many cases, it has been tried to composing functions by SiP or other similar techniques (joining of wafers, etc.). For example, it has been realized to join a semiconductor device wafer to an MEMS wafer comparatively reduced in the increase of film thickness by such a configuration that a layer provided with semiconductor devices can later be separated from a substrate (see, for example, Japanese Patent Laid-open No. 2004-221285). However, according to the SiP or the like method, it may be difficult to make the most of the composite device of semiconductor devices and MEMS produced by an advanced process, due for example to the need for alignment margins at the time of joining.

On the other hand, of manufacturing methods based on the use of SoC, the main method is that MEMS devices are formed on wirings in an electronic circuit by use of a material which can be formed at such a low temperature region as not to damage the wiring layer. However, if the low temperature formable material is difficult to be used in common in other devices' manufacturing steps, the cost is raised accordingly. Besides, in many cases, it may be difficult to obtain desired characteristics on the basis of material constants, and reliability may be poor. The mounting of MEMS devices and other devices on the same wafer is possible on a theoretical basis, but, in consideration of cost and reliability, the practicality of such an approach is considered to differ case by case.

Besides, a manufacturing method has been proposed in which an electronic circuit forming area is preliminarily covered with a protective film, which is removed after the formation of an MEMS device, then an electronic circuit is formed, and the MEMS device and the electronic circuit are connected to each other by a wiring (see, for example, Japanese Patent Laid-open No. Hei 9-162462). However, since the MEMS device in the state of having a comparatively large stepped portion is put into a former step in forming the electronic circuit (FEOL: Front End Of Line) where strict size control is performed, it can be easily supposed that there arise such problems as dimensional scattering in lithography, etching stringer problem, etc. In addition, there is a need to modify the manufacturing process on the basis of each electronic circuit with which the MEMS device is mounted, so that it is impractical to apply such an approach to a diversity of kinds of products.

SUMMARY OF THE INVENTION

Thus, composite modules according to the related art show unsatisfactory characteristics, since a microelectromechanical system (MEMS) and a semiconductor electronic circuit including semiconductor devices (transistors, capacitors, etc.) and wirings are not produced on the same substrate.

Accordingly, there is a demand for a semiconductor composite device, and a manufacturing method of the same, in which semiconductor devices and a microelectromechanical system are formed on the same substrate, and thereafter a wiring for connection between the semiconductor devices and the microelectromechanical system is formed, whereby the semiconductor devices and the microelectromechanical system can be mounted together on the same substrate.

In order to meet the above demand, according to an embodiment of the present invention, a semiconductor composite device includes: a semiconductor device formed on or in a substrate; an insulating film formed on the substrate so as to cover the semiconductor device; a micro electro mechanical portion formed on the insulating film; and a wiring layer for connection with the semiconductor device and the micro electro mechanical portion.

In this semiconductor composite device, the semiconductor device and the micro electro mechanical portion are formed on the same substrate, and the wiring layer for connection with the semiconductor device and the micro electro mechanical portion are formed, so that the micro electro mechanical portion which has hitherto been a single functional device is provided with a composite function.

According to another embodiment of the present invention, a semiconductor composite device includes: a semiconductor device formed on or in a substrate; a micro electro mechanical portion formed on the substrate; and a wiring layer for connection with the semiconductor device and the micro electro mechanical portion. The micro electro mechanical portion is enveloped with a protective film, with an air layer therebetween; and the semiconductor electronic circuit and the micro electro mechanical portion are covered with an insulating film.

In this semiconductor composite device, the semiconductor device and the micro electro mechanical portion are formed on the same substrate, and the wiring layer for connection between the semiconductor device and the micro electro mechanical portion is formed, so that the micro electro mechanical portion which has hitherto been a single functional device is provided with a composite function. Further, since the micro electro mechanical portion is protected inside a sealed cavity, the micro electro mechanical portion is not exposed to the exterior. Therefore, reliability is enhanced, and the need for a gas-tight package is eliminated.

According to a further embodiment, a method of manufacturing a semiconductor composite device includes the steps of: forming a semiconductor device on or in a substrate; forming an insulating film on the substrate so as to cover the semiconductor device; forming a micro electro mechanical portion on the insulating film; and forming a wiring layer for connection with the semiconductor device and the micro electro mechanical portion.

In this method of manufacturing a semiconductor composite device, the semiconductor device and the micro electro mechanical portion are formed on the same substrate, and the wiring layer for connection between the semiconductor device and the micro electro mechanical portion is formed, so that the micro electro mechanical portion which has hitherto been a single functional device is provided with a composite function. In addition, since the insulating film for covering the semiconductor device is formed after the formation of the semiconductor device, the semiconductor device can be formed by an ordinary process. Besides, since the micro electro mechanical portion can be formed on the insulating film for covering the semiconductor device after the formation of the insulating film, the micro electro mechanical portion can be formed by an ordinary process. Thereafter, the wiring layer in connection with the semiconductor device and the micro electro mechanical portion is formed, so that a process at a temperature of not lower than the heat resistance temperature of the wiring layer can be conducted in the step of forming the semiconductor device and in the step of forming the micro electro mechanical portion.

According to yet another embodiment of the present invention, a method of manufacturing a semiconductor composite device includes the steps of: forming a semiconductor device on or in a substrate; forming a micro electro mechanical portion on the substrate; forming an insulating film on the substrate so as to cover the semiconductor device; and forming on the insulating film a wiring layer for connection with the semiconductor device and the micro electro mechanical portion.

In this method of manufacturing a semiconductor composite device, the semiconductor device and the micro electro mechanical portion are formed on the same substrate, and the wiring layer in connection with the semiconductor device and the micro electro mechanical portion is formed, so that the micro electro mechanical portion which has hitherto been a single functional device can be provided with a composite function. In addition, since the semiconductor device and the micro electro mechanical portion are formed in different steps, the semiconductor device can be formed by an ordinary process, and the micro electro mechanical portion can be formed by an ordinary process. Thereafter, the wiring layer for connection between the semiconductor device and the micro electro mechanical portion is formed, so that a process including a temperature of not lower than the heat resistance temperature of the wiring layer can be conducted in the step of forming the semiconductor device and in the step of forming the micro electro mechanical portion. Furthermore, since the micro electro mechanical portion is formed in substantially the same layer as the semiconductor device, the method is effective in, for example, the case where the micro electro mechanical portion has a large stepped portion.

According to an embodiment of the present invention, the semiconductor composite device forms the semiconductor device and the micro electro mechanical portion on the same substrate, so that the micro electro mechanical portion which has hitherto been a single functional device can be provided with a composite function. For example, as for an RF (Radio Frequency) front end module which has hitherto been produced by combining discrete component parts or the like module, the functions equivalent to those of such a module can be realized on a one-chip basis by forming RF component parts such as a filter, a switch, a mixer, an oscillator, etc. as MEMS on chip. This gives various merits such as a large reduction in the module size, suppression of power consumption, a reduction in the manufacturing cost, an increase of the degree of freedom in product design, etc. Furthermore, since the micro electro mechanical portion is enveloped by the protective film with the air layer therebetween and is therefore not exposed to the exterior, reliability is enhanced, and the need for a gas-tight package is eliminated.

According an embodiment of the present invention, the method of manufacturing a semiconductor composite device forms the semiconductor device and the micro electro mechanical portion on the same substrate, so that the micro electro mechanical portion which has hitherto been a single functional device can be provided with a composite function. For example, as for an RF (Radio Frequency) front end module which has hitherto been produced by combining discrete component parts or the like module, the functions equivalent to those of such a module can be realized on a one-chip basis by forming RF component parts such as a filter, a switch, a mixer, an oscillator, etc. as MEMS on chip. This gives various merits such as a large reduction in the module size, suppression of power consumption, a reduction in the manufacturing cost, an increase in the degree of freedom in product design, etc. Furthermore, since the micro electro mechanical portion is enveloped by the protective layer with the air layer therebetween and is therefore not exposed to the exterior, reliability is enhanced, and the need for a gas-tight package is eliminated.

DETAILED DESCRIPTION OF THE PREFERRED EMBODIMENTS

Now, a first example of the semiconductor composite device according to an embodiment of the present invention will be described below, referring to the schematic configuration sectional diagram shown in FIG. 1.

Figure 1:
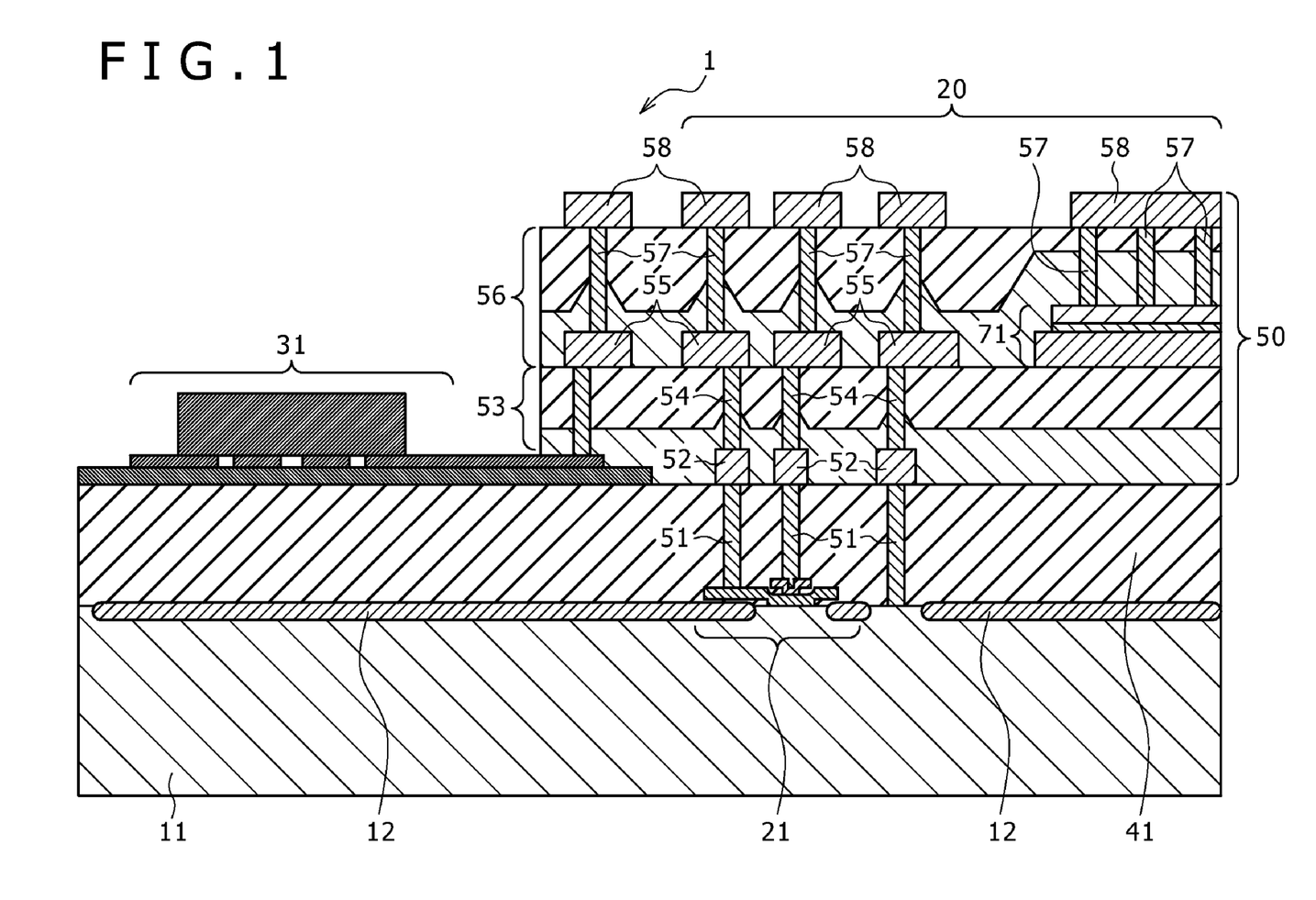
FIG. 1 is a schematic configuration sectional diagram showing a first example of one embodiment of the semiconductor composite device according to an embodiment of the present invention.

As shown in FIG. 1, a semiconductor device 21 is formed on a substrate 11. The semiconductor device 21 is composed, for example, of a semiconductor device such as transistor, capacitor, thyristor, etc. In the example shown in the figure, the semiconductor device 21 is a transistor formed in a device forming region isolated by device isolation regions 12 formed on the substrate 11. In addition, the semiconductor device 21 is covered by an insulating film 41. A microelectromechanical system 31 is formed on the insulating film 41. Further, first plugs 51 for connection with the semiconductor device 21, the substrate 11, and the like are formed in the insulating film 41.

The semiconductor device 21 and the microelectromechanical system 31 are connected to each other through a wiring, the plugs, and the like which are formed in a wiring layer 50. Incidentally, though a wiring for direct connection between the semiconductor device 21 and the microelectromechanical system 31 is not shown in the figure, they are connected to each other through the wiring, the plugs, and the like in a region not appearing in the figure.

The wiring layer 50 has a three-layer wiring structure, for example. The wiring layer 50 includes, for example, the first plugs 51; a first wiring 52 formed on the insulating film 41 and connected to the first plugs 51; a first layer insulating film 53 covering the first wiring 52; second plugs 54 formed in the first layer insulating film 53 and connected to the first wiring 52, the microelectromechanical system 31, and the like; a second wiring 55 formed on the first layer insulating film 53 and connected to the second plugs 54; a second layer insulating film 56 covering the second wiring 55; third plugs 57 formed in the second layer insulating film 56 and connected to the second wiring 55; and a third wiring 58 formed on the second layer insulating film 56 and connected to the third plugs 57.

The microelectromechanical system 31 is exposed to the exterior from the first layer insulating film 53 and the second layer insulating film 56 of the wiring layer 50. For example, the microelectromechanical system 31 is exposed by removing the first layer insulating film 53 and the second layer insulating film 56 of the wiring layer 50 formed on the microelectromechanical system 31. As will be detailed in the description of the manufacturing method later, at the time of removing the first layer insulating film 53 and the second layer insulating film 56, a sacrificing film used in forming the microelectromechanical system 31 is also removed, whereby a space (the voided portion in the figure) for the microelectromechanical system is formed.

In the semiconductor composite device 1, the semiconductor device 21 and the microelectromechanical system 31 are formed on the same substrate 11, and the wiring layer 50 in connection with the semiconductor device 21 and the microelectromechanical system 31 is formed. Therefore, the microelectromechanical system 31 which has hitherto been a single functional device can be provided with a composite function, for example, the function of a semiconductor electronic circuit 20 composed of the semiconductor device 21 and the wiring layer 50. For example, in the case of an RF (Radio Frequency) front end module hitherto produced by combining discrete component parts or the like module, the functions equivalent to those of the module can be realized on a one-chip basis by producing such RF component parts as filter, switch, mixer, oscillator, etc. as MEMS on chip. This has various merits such as a large reduction in the module size, suppression of power consumption, a reduction in the manufacturing cost, an increase in the degree of freedom in product design, etc.

In the next place, a second example of the embodiment of the semiconductor composite device in the present invention will be described below, referring to the schematic configuration sectional diagram shown in FIG. 2.

Figure 2:
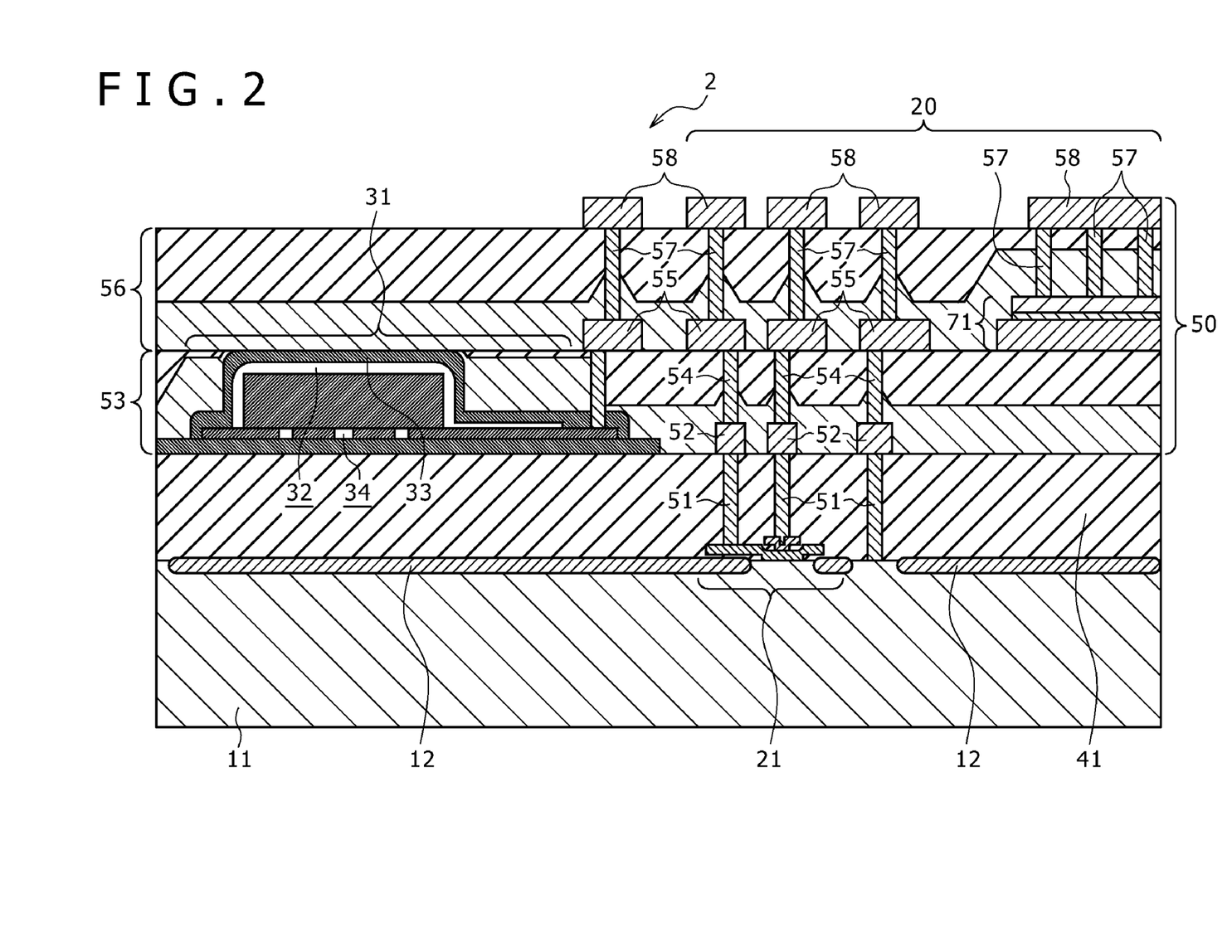
FIG. 2 is a schematic configuration sectional diagram showing a second example of the one embodiment of the semiconductor composite device according to an embodiment of the present invention.

As shown in FIG. 2, a semiconductor device 21 is formed on a substrate 11. The semiconductor device 21 is composed, for example, of a semiconductor device such as transistor, capacitor, thyristor, etc. In the example shown in the figure, the semiconductor device 21 is a transistor formed in a device forming region isolated by device isolation regions 12 formed on the substrate 11. A microelectromechanical system 31 is formed on an insulating film 41. First plugs 51 connected to the semiconductor device 21, the substrate 11, and the like are formed in the insulating film 41.

The semiconductor device 21 and the microelectromechanical system 31 are connected by wirings, plugs, and the like which are formed in a wiring layer 50. Incidentally, though a wiring for direct connection between the semiconductor device 21 and the microelectromechanical system 31 is not shown in the figure, they are connected to each other by a wiring, plugs, and the like which do not appear in the figure.

The wiring layer 50 has a three-layer wiring structure, for example. The wiring layer 50 includes, for example, the first plugs 51; a first wiring 52 formed on the insulating film 41 and connected to the first plugs 51; a first layer insulating film 53 covering the first wiring 52; second plugs 54 formed in the first layer insulating film 53 and connected to the first wiring 52, the microelectromechanical system 31, and the like; a second wiring 55 formed on the first layer insulating film 53 and connected to the second plugs 54; a second layer insulating film 56 covering the second wiring 55; third plugs 57 formed in the second layer insulating film 56 and connected to the second wiring 55; and a third wiring 58 formed on the second layer insulating film 56 and connected to the third plugs 57.

The microelectromechanical system 31 is enveloped by a protective film 33, with a space 32 at a part therebetween. The first layer insulating film 53 is formed on the protective film 33.

In this semiconductor composite device 2, the semiconductor device 21 and the microelectromechanical system 31 are formed on the same substrate 11, and the wiring layer 50 connected to the semiconductor device 21 and the microelectromechanical system 31 is formed. Therefor, the microelectromechanical system 31 which has hitherto been a single functional device can be provided with a composite function, for example, the function of a semiconductor electronic circuit 20 composed of the semiconductor device 21 and the wiring layer 50. For example, in the case of an RF (Radio Frequency) front end module which has hitherto been produced by combining discrete component parts or the like module, the functions equivalent to those of the module can be realized on a one-chip basis by forming an RF component part such as filter, switch, mixer, oscillator, etc. as MEMS on chip. This gives various merits such as a large reduction of module size, suppression of power consumption, a reduction in the manufacturing cost, an increase in the degree of freedom in product design, etc. Further, since the microelectromechanical system 31 is enveloped by the protective film 33 with the air layer 32 therebetween and the microelectromechanical system 31 is therefore not exposed to the exterior, reliability is enhanced, and the need for a gas-tight package is eliminated.

Now, a third example of the embodiment of the semiconductor composite device in the present invention will be described below, referring to the schematic configuration sectional diagram shown in FIG. 3.

Figure 3:
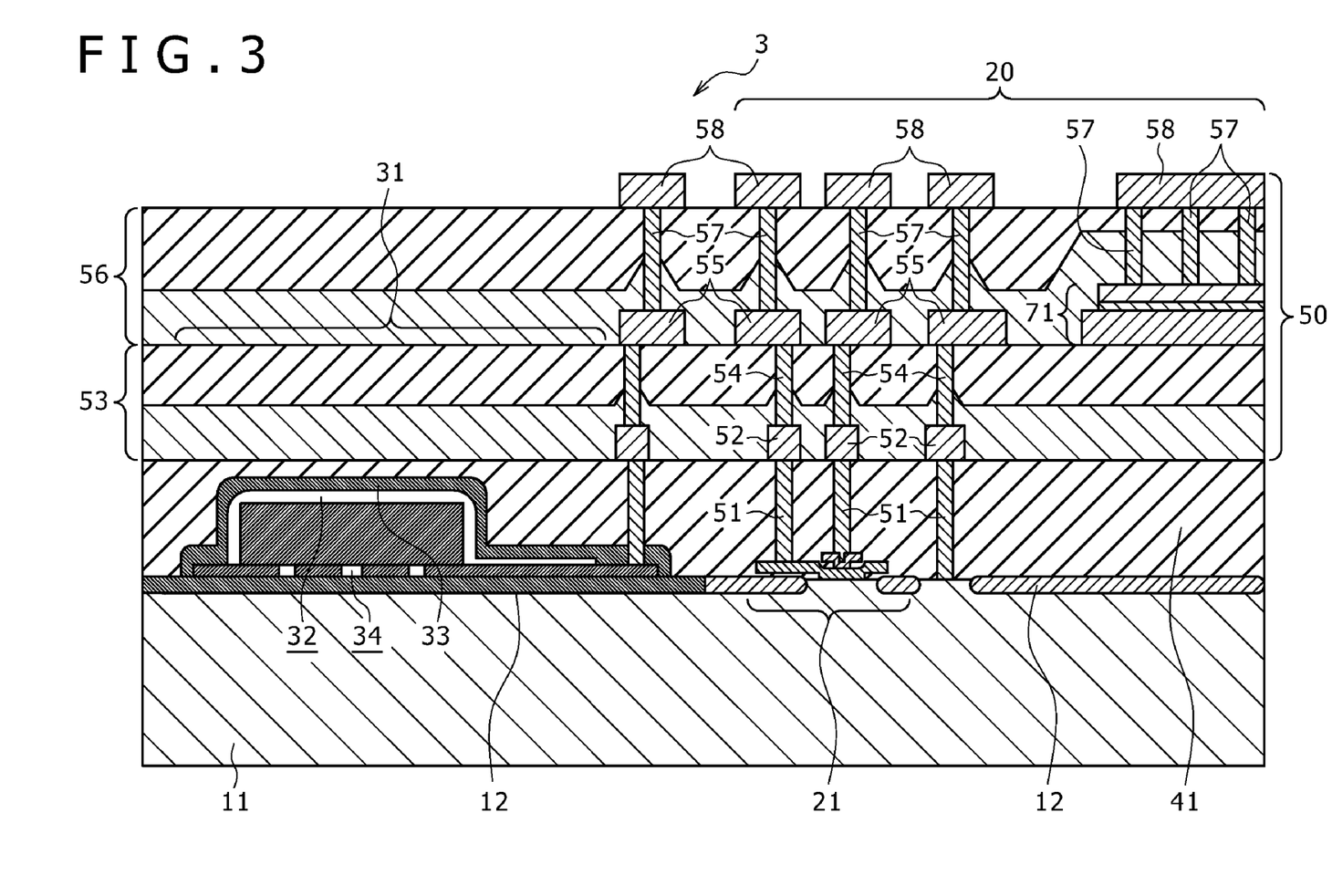
FIG. 3 is a schematic configuration sectional diagram showing a third example of the one embodiment of the semiconductor composite device according to an embodiment of the present invention.

As shown in FIG. 3, a semiconductor device 21 is formed on a substrate 11. The semiconductor device 21 is composed, for example, of a semiconductor device such as transistor, capacitor, thyristor, etc. In the example shown in the figure, the semiconductor device 21 is a transistor having a device forming region isolated by device isolation regions 12 formed on the substrate 11.

In addition, a microelectromechanical system 31 is formed on the substrate 11. The microelectromechanical system 31 is enveloped by a protective film 33 with a space 32 at a part therebetween.

Besides, the semiconductor device 21 and the protective film 33 are covered with an insulating film 41. Further, first plugs 51 connected to the semiconductor device 21, the substrate 11, the microelectromechanical system 31, and the like are formed in the insulating film 41.

The semiconductor device 21 and the microelectromechanical system 31 are connected to each other by a wiring, plugs, and the like in a wiring layer 50. Incidentally, though a wiring for direct connection between the semiconductor device 21 and the microelectromechanical system 31 is not shown in the figure, they are connected to each other by a wiring, plugs, and the like in the portion not appearing in the figure.

The wiring layer 50 has a three-layer wiring structure, for example. The wiring layer 50 includes, for example, the first plugs 51; a first wiring 52 formed on the insulating film 41 and connected to the first plugs 51; a first layer insulating film 53 covering the first wiring 52; second plugs 54 formed in the first layer insulating film 53 and connected to the first wiring 52, the microelectromechanical system 31, and the like; a second wiring 55 formed on the first layer insulating film 53 and connected to the second plugs 54; a second layer insulating film 56 covering the second wiring 55; third plugs 57 formed in the second layer insulating film 56 and connected to the second wiring 55; and a third wiring 58 formed on the second layer insulating film 56 and connected to the third plugs 57.

In this semiconductor composite device 3, the semiconductor device 21 and the microelectromechanical system 31 are formed on the same substrate 11, and the wiring layer 50 in connection with the semiconductor device 21 and the microelectromechanical system 31 is formed. Therefore, the microelectromechanical system 31 which has hitherto been a single functional device can be provided with a composite function, for example, the function of a semiconductor electronic circuit 20 composed of the semiconductor device 21 and the wiring layer 50. For example, in the case of an RF (Radio Frequency) front end module hitherto produced by combining discrete component parts or the like module, the functions equivalent to those of the module can be realized on a one-chip basis by forming an RF component part such as filter, switch, mixer, oscillator, etc. as MEMS on chip. This gives a variety of merits such as a large reduction in module size, suppression of power consumption, a reduction in the manufacturing cost, an increase in the degree of freedom in product design, etc. In addition, since the microelectromechanical system 31 is enveloped by the protective film 33 with the air layer 32 therebetween and the microelectromechanical system 31 is therefore not exposed to the exterior, reliability is enhanced, and the need for a gas-tight package is eliminated. Further, since the semiconductor device 21 and the microelectromechanical system 31 are mounted together on substantially the same layer, this configuration is effective in the case where the microelectromechanical system 31 has a large stepped portion and the like cases.

Now, a first example of an embodiment of the method of manufacturing a semiconductor composite device in the present invention will be described below, referring to manufacturing step sectional diagrams shown in FIGS. 4A to 4C. Here, as an example, the manufacturing steps of the semiconductor composite device 1 described referring to FIG. 1 above are shown.

Figure 4A:
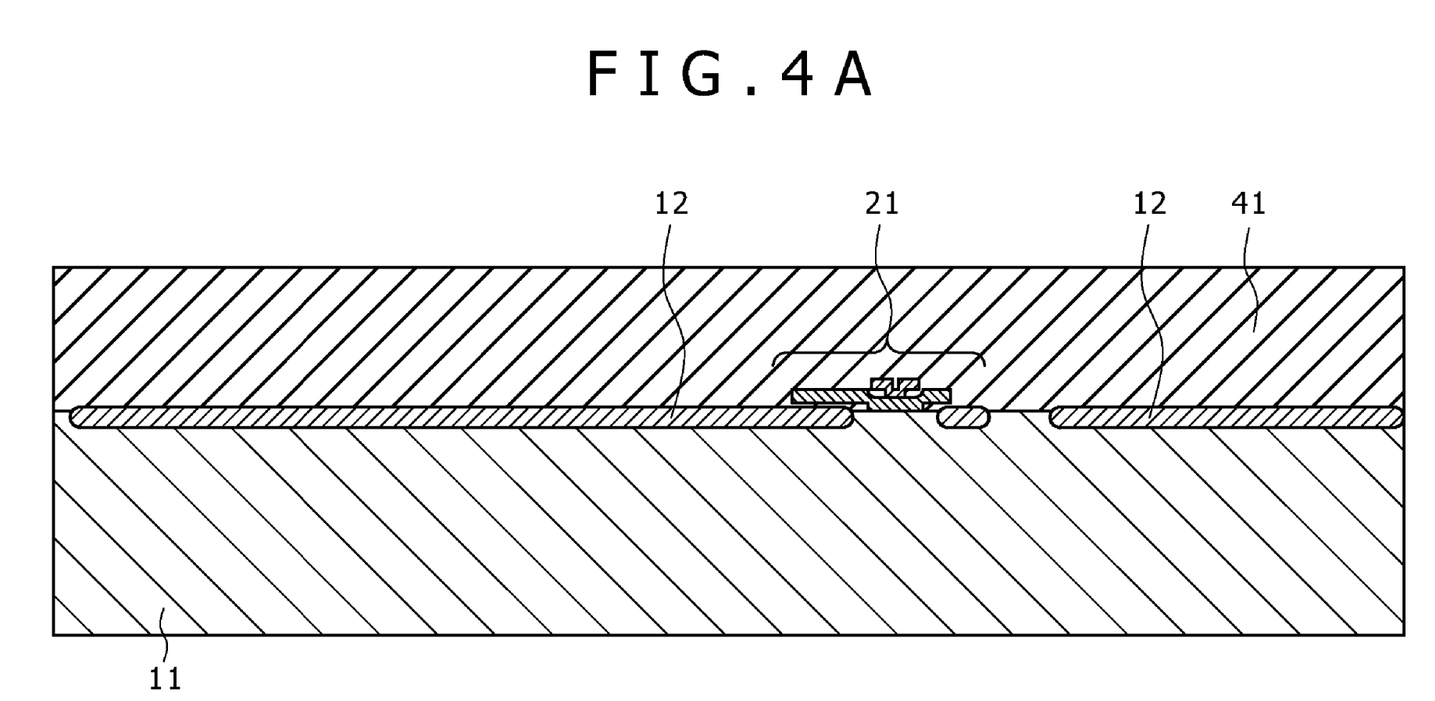
FIG. 4A is a manufacturing step sectional diagram showing a first example of the method of manufacturing a semiconductor composite device according to an embodiment of the present invention.

As shown in FIG. 4A, device isolation regions 12 are formed on a substrate 11, to demarcate a device forming region. Next, a semiconductor device 21 is formed in the device forming region. The semiconductor device 21 is composed, for example, of a transistor, a capacitor, a resistor, a thyristor or the like. In the example shown in the figure, the semiconductor device 21 is composed of a transistor. The method of manufacturing the semiconductor device 21 may be an existing manufacturing method. Next, the semiconductor device 21 is covered with an insulating film 41.

Figure 4B:
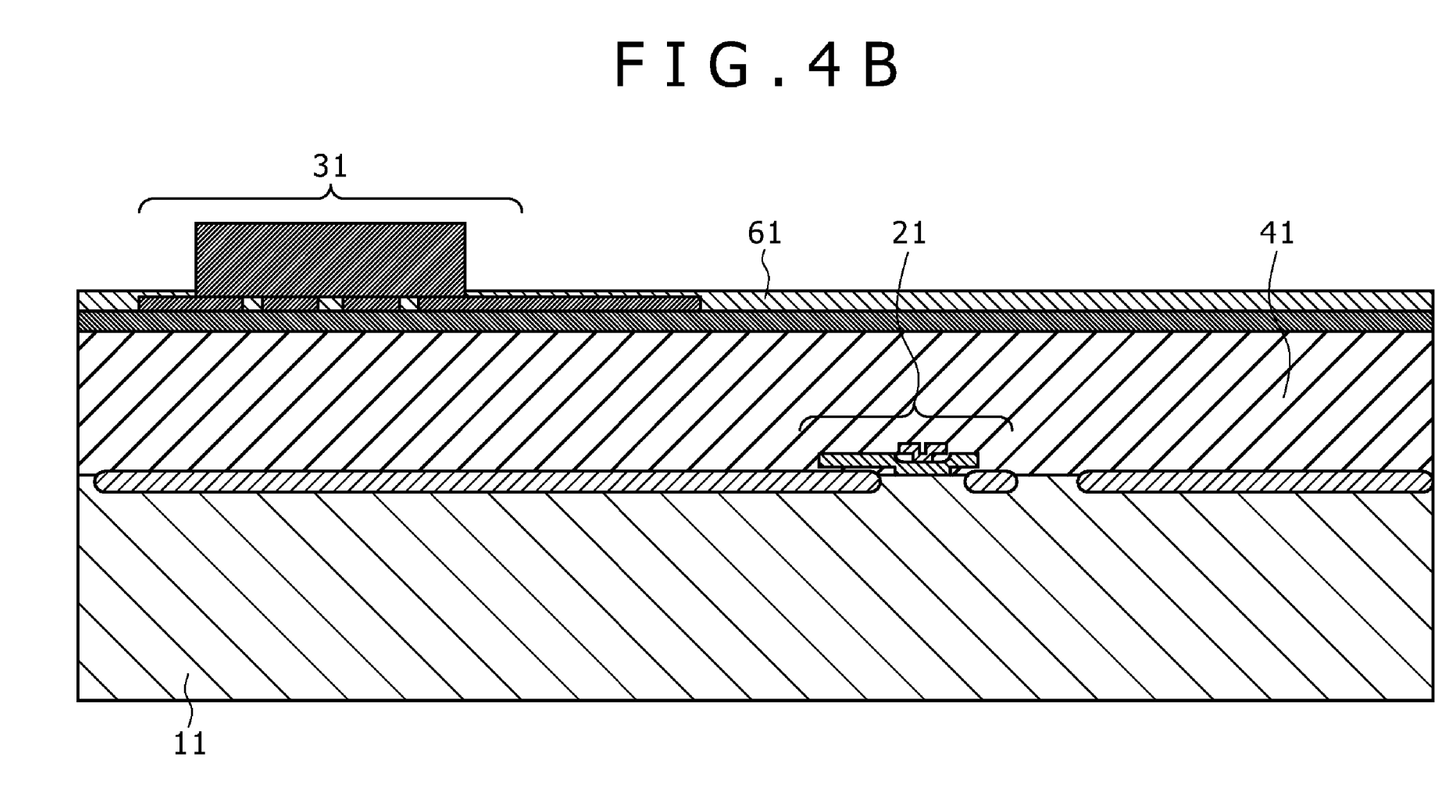
FIG. 4B is a manufacturing step sectional diagram showing the first example of the method of manufacturing a semiconductor composite device according to an embodiment of the present invention.

Subsequently, as shown in FIG. 4B, a microelectromechanical system 31 is formed on the insulating film 41. The microelectromechanical system 31 can be manufactured by an existing manufacturing method. In this case, a sacrificing film 61 is preliminarily formed at least in the area for forming a space for the microelectromechanical system 31. The sacrificing film 61 is removed in a later step, whereby the space for the microelectromechanical system 31 is formed. In addition, those component parts of the microelectromechanical system 31 which are located in other regions than the region where the microelectromechanical system 31 is to be formed are removed.

In this example of the embodiment, signal lines for the microelectromechanical system 31 and the semiconductor device 21 can be composed of polycrystalline silicon with phosphorus (P) doped thereto as an impurity. In this case, a heat treatment at a high temperature may be necessary to activate polycrystalline silicon, the heat treatment produces no problem on the manufacturing basis, since it is conducted before the formation of the wiring layer which will be described below.

Figure 4C:
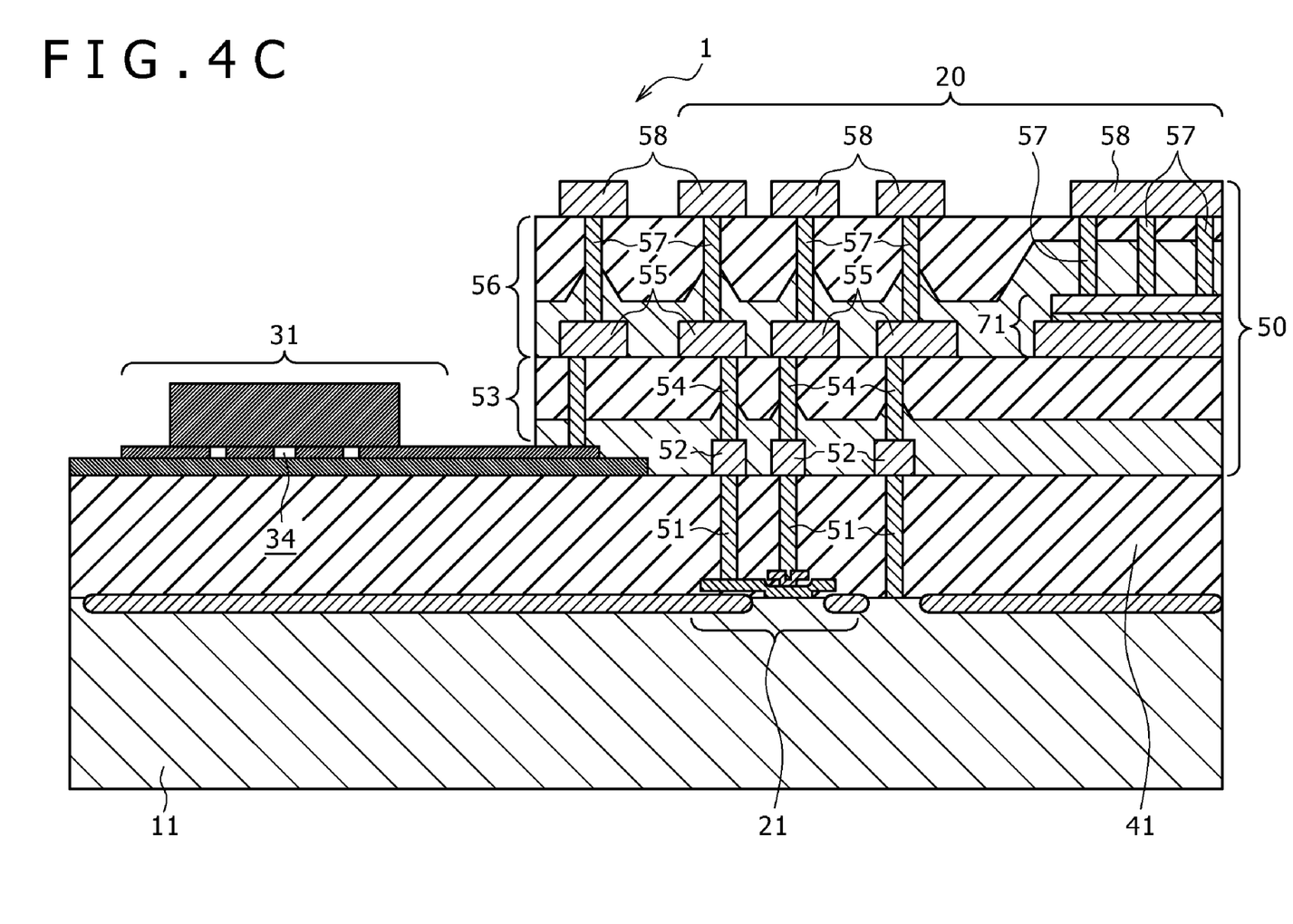
FIG. 4C is a manufacturing step sectional diagram showing the first example of the method of manufacturing a semiconductor composite device according to an embodiment of the present invention.

Next, as shown in FIG. 4C, a wiring layer 50 connected to the semiconductor device 21 and the microelectromechanical system 31 is formed. The wiring layer 50 can be formed by an ordinary multi-layer wiring technology. Here, the wiring layer 50 has a three-layer wiring structure, for example.

First, first plugs 51 in connection with the semiconductor device 21, the substrate 11, and the like are formed in the insulating film 41. Next, a first wiring 52 for connection with the first plugs 51 is formed on the insulating film 41. Subsequently, a first layer insulating film 53 covering the first wiring 52 is formed.

Next, second plugs 54 connected to the first wiring 52, the microelectromechanical system 31, and the like is formed in the first layer insulating film 53. Subsequently, a second wiring 55 connected to the second plugs 54 is formed on the first layer insulating film 53. Further, by utilizing a part of the second wiring 55, an MIM capacitor 71 is formed. Next, a second layer insulating film 56 covering the second wiring 55, the MIM capacitor 71, and the like is formed.

Subsequently, third plugs 57 connected to the second wiring 55 are formed in the second layer insulating film 56. Next, a third wiring 58 in connection with the third plugs 57 is formed on the second layer insulating film 56.

The first, second, and third plugs 51, 54, and 57 can be formed by an existing plug forming technique. For example, the plugs can be composed of tungsten plugs, polysilicon plugs, or the like. The first, second, and third wirings 52, 55, and 58 can be formed by an existing wiring forming technique. For example, the wirings can be composed of metallic wirings of aluminum, an aluminum alloy, or the like, polysilicon wirings, or the like. The first and second layer insulating films 53 and 56 can be formed by an existing layer insulating film forming technique. For example, the layer insulating films can be composed of a silicon oxide film formed by a chemical vapor deposition (CVD) method. Besides, in order to reduce the parasitic capacitance between the wirings, a so-called low dielectric constant film formed of a material lower than silicon oxide in dielectric constant may be adopted. In addition, the layer insulating films may be composed of a layered film of a low dielectric constant film with an inorganic film such as a silicon oxide film. Incidentally, a wiring for direct connection between the semiconductor device 21 and the microelectromechanical system 31 is not shown in the figure, they are connected to each other by a wiring, plugs, and the like in the portion not appearing in the figure.

Thereafter, the sacrificing film 61 [see FIG. 4B], the first and second layer insulating films 53 and 56 and the like on the microelectromechanical system 31 and in the surroundings thereof are removed, to form a space 34 for the microelectromechanical system 31. This removal can be conducted, for example, by use of a hydrofluoric acid based wet etching in the case where the sacrificing film 61, the first and second layer insulating films 53 and 56 and the like are composed of silicon oxide based films.

In this method of manufacturing the semiconductor composite device 1, the semiconductor device 21 and the microelectromechanical system 31 are formed on the same substrate 11, so that the microelectromechanical system 31 which has hitherto been a single functional device can be provided with a composite function. For example, in the case of an RF (Radio Frequency) front end module which has hitherto been produced by combining discrete component parts or the like module, the functions equivalent to those of the module can be realized on a one-chip basis by forming the RF component parts such as filter, switch, mixer, oscillator, etc. as microelectromechanical system 31 on chip. This gives various merits such as a large reduction of module size, suppression of power consumption, a reduction in the manufacturing cost, an increase in the degree of freedom in product design, etc.

Now, a second example of the embodiment of the method of manufacturing a semiconductor composite device in the present invention will be described below, referring to FIG. 4A and FIG. 2. Here, as an example, the manufacturing steps of the semiconductor composite device 2 shown in FIG. 2 will be described.

As shown in FIG. 4A, device isolation regions 12 are formed on a substrate 11, to demarcate a device forming region. Next, a semiconductor device 21 is formed in the device forming region. The semiconductor device 21 is composed, for example, of a transistor, a capacitor, a resistor, a thyristor, or the like. In the example shown in the figure, the semiconductor device 21 is composed of a transistor. The semiconductor device 21 can be produced by an existing manufacturing method. Subsequently, the semiconductor device 21 is covered with an insulating film 41.

Next, as shown in FIG. 2, a microelectromechanical system 31 is formed on the insulating film 41. The microelectromechanical system 31 can be formed by an existing manufacturing method. In this case, a sacrificing film (not shown) is preliminarily formed at least in the area for forming a space for the microelectromechanical system 31. In addition, a protective film 33 is formed on the upper side of the microelectromechanical system 31, with a sacrificing film (not shown) therebetween. Thereafter, a part of the protective film 33 is opened, the sacrificing films are removed so as to form a space 34 for the microelectromechanical system 31 and to form a space 32 between the microelectromechanical system 31 and the protective film 33. Where the sacrificing films are composed of silicon oxide based films, they can be removed by a hydrofluoric acid based wet etching, for example.

In this example of the embodiment, signal lines for the microelectromechanical system 31 and the semiconductor device 21 can be composed of polycrystalline silicon with phosphor (P) added thereto as an impurity. In this case, a heat treatment at a high temperature may be necessary to activate the polycrystalline silicon, but the heat treatment produces no problem on a manufacturing basis, since it is conducted before the formation of a wiring layer which will be described below.

Subsequently, a wiring layer 50 connected to the semiconductor device 21 and the microelectromechanical system 31 is formed. The wiring layer 50 can be formed by an ordinary multi-layer wiring technique. Here, the wiring layer 50 has a three-layer wiring structure, for example.

First, first plugs 51 connected to the semiconductor device 21, the substrate 11, and the like are formed in the insulating film 41. Next, a first wiring 52 connected to the first plugs 51 is formed on the insulating film 41. Subsequently, a first layer insulating film 53 covering the first wiring 52, the protective film 33, and the like is formed.

Next, second plugs 54 connected to the first wiring 52, the microelectromechanical system 31, and the like are formed in the first layer insulating film 53. Subsequently, a second wiring 55 connected to the second plugs 54 is formed on the first layer insulating film 53. Further, by utilizing a part of the second wiring 55, an MIM capacitor 71 is formed. Next, a second layer insulating film 56 covering the second wiring 55, the MIM capacitor 71, and the like is formed.

Subsequently, third plugs 57 connected to the second wiring 55 are formed in the second layer insulating film 56. Next, a third wiring 58 connected to the third plugs 57 is formed on the second layer insulating film 56.

The first, second, and third plugs 51, 54, and 57 can be formed by an existing plug forming technique. For example, the plugs may be composed of tungsten plugs, polysilicon plugs, or the like. The first, second, and third wirings 52, 55, and 58 can be formed by an existing wiring forming technique. For example, the wirings may be composed of metallic wirings of aluminum, an aluminum alloy, or the like, polysilicon wirings, or the like. The first and second layer insulating films 53 and 56 can be formed by an existing layer insulating film forming technique. For example, the layer insulating films may be composed of silicon oxide films formed by a chemical vapor deposition (CVD) method. Besides, in order to reduce the parasitic capacitance between the wirings, a so-called low dielectric constant film may be adopted which is formed of a material lower than silicon oxide in dielectric constant. In addition, a layered film of a low dielectric constant film with an inorganic film of silicon oxide or the like may also be adopted. Incidentally, though a wiring for direct connection between the semiconductor device 21 and the microelectromechanical system 31 is not shown in the figure, they are connected to each other through a wiring, plugs, or the like in an area not appearing in the figure.

In this method of manufacturing the semiconductor composite device 2, the semiconductor device 21 and the microelectromechanical system 31 are formed on the same substrate 11, so that the microelectromechanical system 31 which has hitherto been a single functional device can be provided with a composite function. For example, in the case of an RF (Radio Frequency) front end module which has hitherto been produced by combining discrete component parts or the like module, the functions equivalent to those of the module can be realized on a one-chip basis by forming the RF component parts such as filter, switch, mixer, oscillator, etc. as microelectromechanical system 31 on chip. This gives various merits such as a large reduction in module size, suppression of power consumption, a reduction in the manufacturing cost, an increase in the degree of freedom in product design, etc.

Further, since the microelectromechanical system 31 is enveloped by the protective film 33 with the air layer 32 therebetween and the microelectromechanical system 31 is therefore not exposed to the exterior, reliability is enhanced, and the need for a gas-tight package is eliminated.

Now, a third example of the embodiment of the method of manufacturing a semiconductor composite device in the present invention will be described below, referring to FIG. 4A and FIG. 3. Here, as an example, manufacturing steps of the semiconductor composite device 3 shown in FIG. 3 will be described.

As shown in FIG. 4A, device isolation regions 12 are formed on a substrate 11, to demarcate a device forming region. Next, a semiconductor device 21 is formed in the device forming region. The semiconductor device 21 is composed, for example, of a transistor, a capacitor, a resistor, a thyristor, or the like. In the example shown in the figure, the semiconductor device 21 is composed of a transistor. The semiconductor device 21 can be produced by an existing manufacturing method.

Next, as shown in FIG. 3, a microelectromechanical system 31 is formed on the substrate 11. The microelectromechanical system 31 can be formed by an existing manufacturing method. In this case, a sacrificing film (not shown) is preliminarily formed at least in the area for forming a space for the microelectromechanical system 31. In addition, a protective film 33 is formed on the upper side of the microelectromechanical system 31, with a sacrificing film (not shown) therebetween. Thereafter, a part of the protective film 33 is opened, the sacrificing films are removed so as to form a space 34 for the microelectromechanical system 31 and to form a space 32 between the microelectromechanical system 31 and the protective film 33. Where the sacrificing films are composed of silicon oxide based films, they can be removed by a hydrofluoric acid based wet etching, for example.

In this example of the embodiment, signal lines for the microelectromechanical system 31 and the semiconductor device 21 can be composed of polycrystalline silicon with phosphor (P) added thereto as an impurity. In this case, a heat treatment at a high temperature may be necessary to activate the polycrystalline silicon, but the heat treatment produces no problem on a manufacturing basis, since it is conducted before the formation of a wiring layer which will be described below.

Subsequently, an insulating film 41 covering the semiconductor device 21 and the protective film 33 is formed.

Next, a wiring layer 50 connected to the semiconductor device 21 and the microelectromechanical system 31 is formed. The wiring layer 50 can be formed by an ordinary multi-layer wiring technique. Here, the wiring layer 50 has a three-layer wiring structure, for example.

First, first plugs 51 connected to the semiconductor device 21, the substrate 11, the microelectromechanical system 31, and the like are formed in the insulating film 41. Next, a first wiring 52 connected to the first plugs 51 is formed on the insulating film 41. Subsequently, a first layer insulating film 53 covering the first wiring 52 is formed.

Next, second plugs 54 connected to the first wiring 52 are formed in the first layer insulating film 53. Subsequently, a second wiring 55 connected to the second plugs 54 is formed on the first layer insulating film 53. Further, by utilizing a part of the second wiring 55, an MIM capacitor 71 is formed. Next, a second layer insulating film 56 covering the second wiring 55, the MIM capacitor 71, and the like is formed.

Subsequently, third plugs 57 connected to the second wiring 55 and the MIM capacitor 71 are formed in the second layer insulating film 56. Next, a third wiring 58 connected to the third plugs 57 is formed on the second layer insulating film 56.

The first, second, and third plugs 51, 54, and 57 can be formed by an existing plug forming technique. For example, the plugs may be composed of tungsten plugs, polysilicon plugs, or the like. The first, second, and third wirings 52, 55, and 58 can be formed by an existing wiring forming technique. For example, the wirings may be composed of metallic wirings of aluminum, an aluminum alloy, or the like, polysilicon wirings, or the like. The first and second layer insulating films 53 and 56 can be formed by an existing layer insulating film forming technique. For example, the layer insulating films may be composed of silicon oxide films formed by a chemical vapor deposition (CVD) method. Besides, in order to reduce the parasitic capacitance between the wirings, a so-called low dielectric constant film may be adopted which is formed of a material lower than silicon oxide in dielectric constant. In addition, a layered film of a low dielectric constant film with an inorganic film of silicon oxide or the like may also be adopted. Incidentally, though a wiring for direct connection between the semiconductor device 21 and the microelectromechanical system 31 is not shown in the figure, they are connected to each other through a wiring, plugs, or the like in an area not appearing in the figure.

In this method of manufacturing the semiconductor composite device 3, the semiconductor device 21 and the microelectromechanical system 31 are formed on the same substrate 11, so that the microelectromechanical system 31 which has hitherto been a single functional device can be provided with a composite function. For example, in the case of an RF (Radio Frequency) front end module which has hitherto been produced by combining discrete component parts or the like module, the functions equivalent to those of the module can be realized on a one-chip basis by forming the RF component parts such as filter, switch, mixer, oscillator, etc. as microelectromechanical system 31 on chip. This gives various merits such as a large reduction in module size, suppression of power consumption, a reduction in the manufacturing cost, an increase in the degree of freedom in product design, etc.

In addition, since the microelectromechanical system 31 is enveloped by the protective film 33 with the air layer 32 therebetween and is therefore not exposed to the exterior, reliability is enhanced, and the need for a gas-tight package is eliminated. Further, since the microelectromechanical system 31 is formed in substantially the same layer as the semiconductor device 21, this configuration is effective in the case where the microelectromechanical system 31 has a large stepped portion and the like cases.

Now, as an application example based on the configurations described in the embodiments above, a high-frequency band pass filter using a beam type MEMS resonator will be described below, referring to a schematic configuration perspective diagram of a beam type MEMS resonator, shown in FIG. 5A, and a plan layout diagram of the high-frequency band pass filter using the beam type MEMS resonator, shown in FIG. 5B.

Figure 5A:
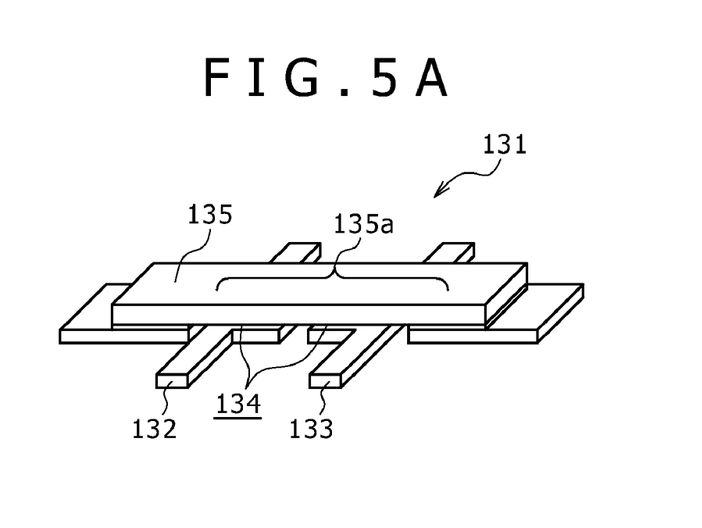
FIG. 5A is a schematic configuration perspective diagram of a beam type MEMS resonator.

The beam type MEMS resonator 131 shown in FIG. 5A includes an input line 132, an output line 133 disposed in parallel to the input line 132, and an oscillator electrode 135 supported at both ends thereof, with predetermined spaces 134 between itself and the input line 132 and the output line 133. When a high-frequency input signal is impressed on the input line 132, a beam (oscillating portion) 135a of the oscillator electrode 135 provided on the upper side of the output line 133 with the space 134 therebetween is mechanically resonated by a high-frequency signal conforming to its natural frequency, whereby the parasitic capacitance of a capacitor composed of the space 134 between the output line 133 and the beam (oscillating portion) 135a is varied, and the variation is outputted through the output line 133 as a filtered signal.

Figure 5B:
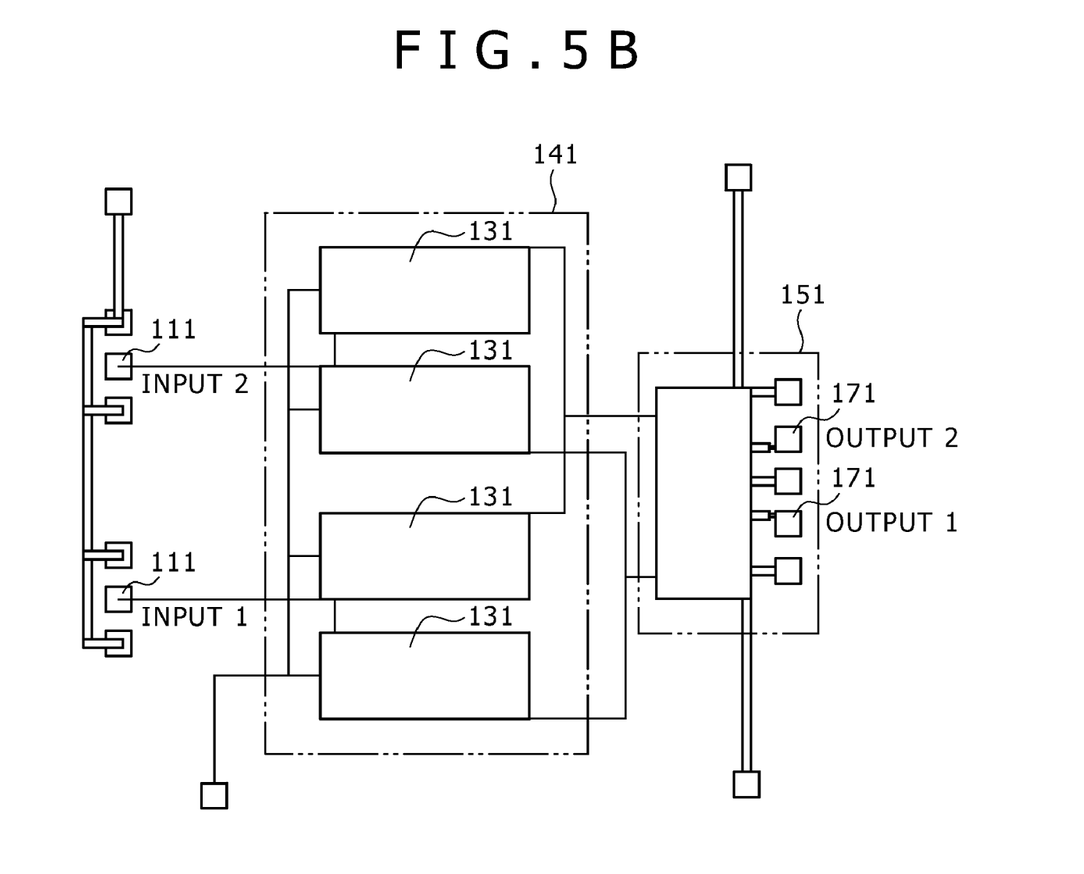
FIG. 5B is a plan layout diagram of an RF band filter using the beam type MEMS resonator shown in FIG. 5A.

The high-frequency band pass filter using the beam type MEMS resonator, shown in FIG. 5B, is so configured that a signal inputted from pads 111 on the left in the drawing is filtered when passing through a microelectromechanical system (high-frequency band pass filter 141) composed of MEMS resonators 131 connected in a lattice form, the filtered signal is amplified by a semiconductor electronic circuit (amplifier 151) at the following stage, and the amplified signal is outputted to pads 171 on the right in the drawing. According to the related art, the components of the high-frequency band pass filter 141 composed of the amplifier 151 and the MEMS resonator 131 are individually produced, and they are connected by wire bonding or the like at the time of mounting. According to an embodiment of the present invention, on the other hand, the high-frequency band pass filter 141 can be produced as a device in which the component parts are mounted on the same substrate on a one-chip basis.

Figure 6:
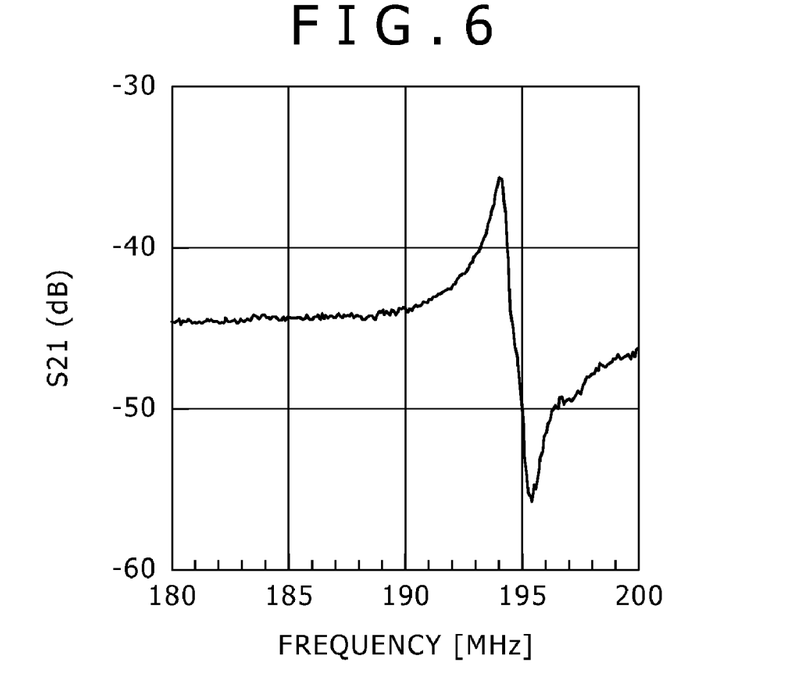
FIG. 6 is a diagram showing the resonance characteristic of a beam type resonator produced by the manufacturing method according to an embodiment of the present invention.
Figure 7:
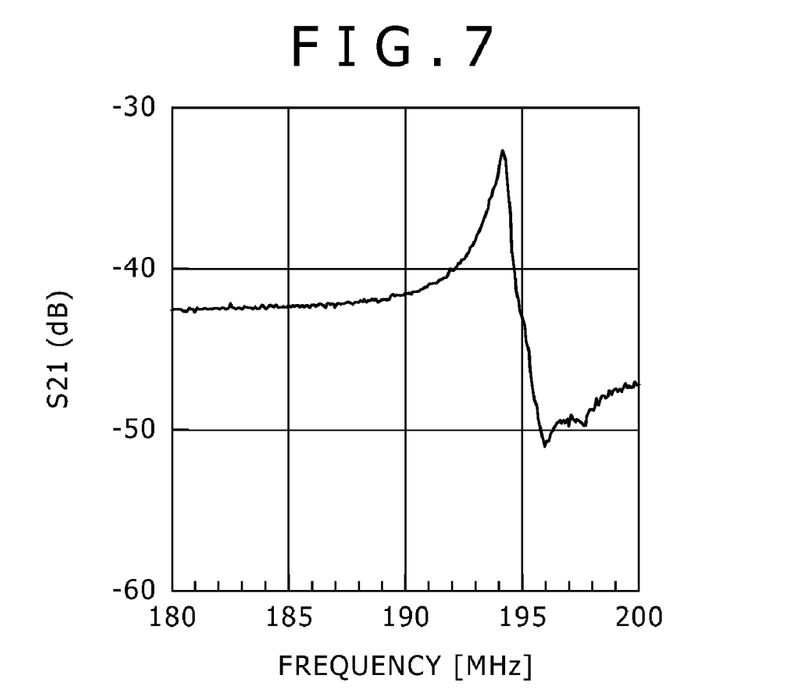
FIG. 7 is a diagram showing the resonance characteristic of a beam type resonator produced as a single device.

The resonance characteristic of a beam type resonator which has been mounted together with other device(s) through the manufacturing steps described referring to FIGS. 4A to 4C above is shown in FIG. 6. On the other hand, the resonance characteristic of a resonator produced as a single device is shown in FIG. 7. A comparison between the resonance characteristics shown respectively in FIG. 6 and in FIG. 7 shows that comparable characteristics are obtained, from the viewpoints of resonance frequency, transmission characteristic, and the like. Incidentally, S21 on the axis of ordinates in FIGS. 6 and 7 represents the power transmission level of signal, and the axis of abscissas represents frequency.

Figure 8:
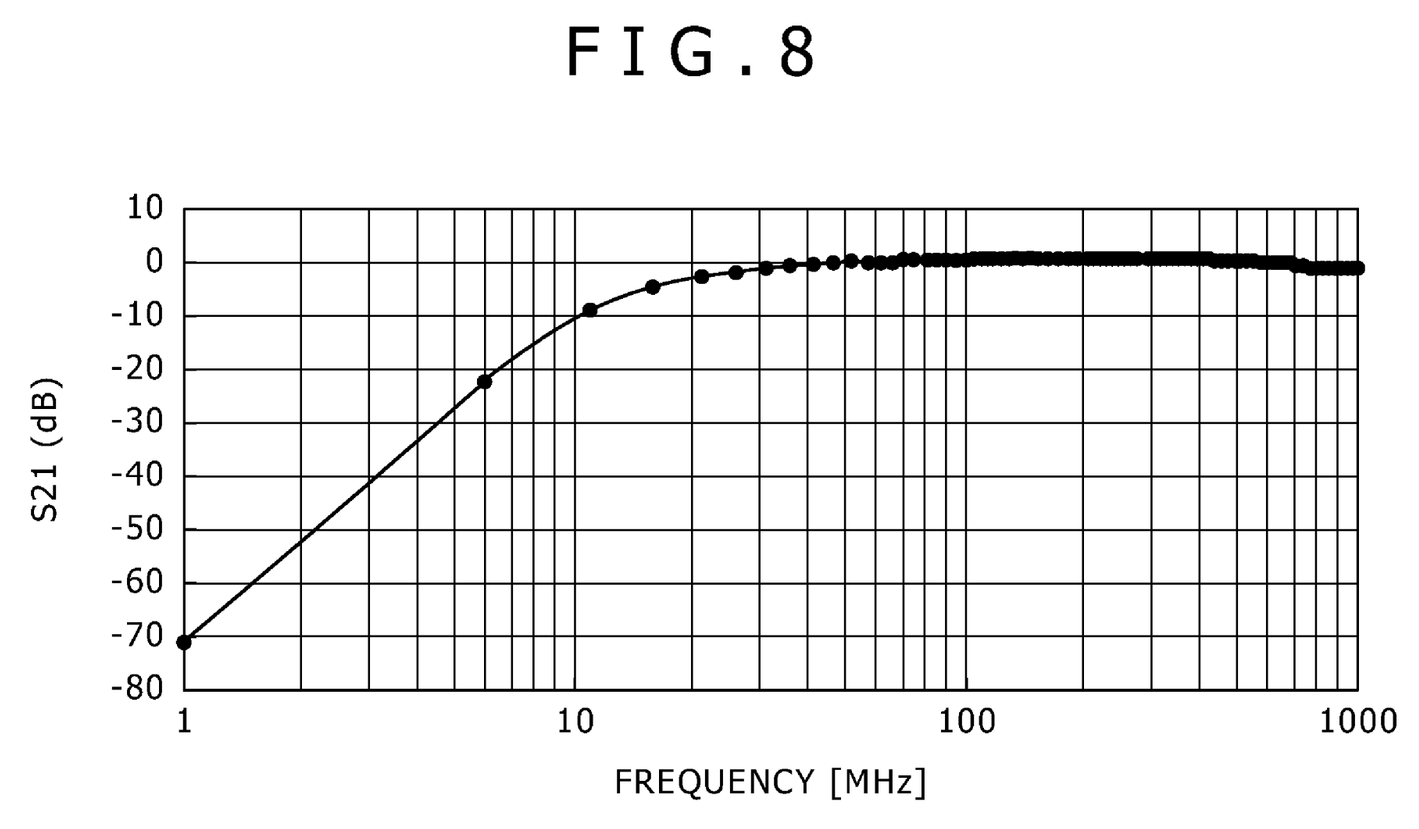
FIG. 8 is a diagram showing the output characteristic of an emitter follower (E/F) mounted together with a microelectromechanical system (MEMS) on the same substrate.

In addition, the output characteristic of an emitter follower (E/F) circuit mounted together with the microelectromechanical system (MEMS) 31 is shown in FIG. 8. It is seen that a gain as designed is obtained, and the step of forming the microelectromechanical system 31 at a high temperature has little influenced the semiconductor electronic circuit 20 mounted together with the microelectromechanical system 31. Incidentally, S21 on the axis of ordinates in FIG. 8 represents the power transmission level of signal, and the axis of abscissas represents frequency.

As has been described above, the semiconductor composite devices 1 to 3 in the present invention include the semiconductor electronic circuit 20 and the microelectromechanical system (MEMS) 31 mounted together on the same substrate 11, and the layout can be appropriately modified according to the desired characteristics, sizes, and the like of the semiconductor electronic circuit 20, the semiconductor device 21, and the microelectromechanical system 31 which are mounted together on the same substrate 11.

Besides, the microelectromechanical system 31 described above can be used to constitute not only the high-frequency band pass filter in which the system is used as a resonator as above-mentioned but also analog devices for high-frequency use, for example, switch, oscillator, mixer, inductor, variable capacitor, or the like.

The present invention is not limited to the details of the above-described preferred embodiments. The scope of the invention is defined by the appended claims and all changes and modifications as fall within the equivalence of the scope of the claims are therefore to be embraced by the invention.

What is claimed is:

1. A semiconductor composite device comprising:
   a substrate;
   semiconductor device formed on or in said substrate;
   an insulating film formed on said substrate so as to cover said semiconductor device;
   a micro electro mechanical portion formed on said insulating film and configured to accept thereon a micro electro mechanical device; and
   a wiring layer with wiring connected to said semiconductor device and said micro electro mechanical portion,
   wherein,
      said wiring layer includes another insulating film, and wiring formed on said another insulating film,
      said another insulating film does not cover said micro electro mechanical portion, and
      said micro electro mechanical portion is exposed.

2. A semiconductor composite device comprising:
   semiconductor device formed on or in a substrate;
   micro electro mechanical portion formed on said substrate; and
   wiring layer for connection with said semiconductor device and said micro electro mechanical portion; wherein
   aid micro electro mechanical portion is enveloped with a protective film, with an air layer therebetween; and
   aid semiconductor electronic circuit and said micro electro mechanical portion are covered with an insulating film.

* * * * *